(12) United States Patent
Omori

(10) Patent No.: US 11,890,711 B2
(45) Date of Patent: Feb. 6, 2024

(54) PROCESSING APPARATUS

(71) Applicant: DISCO CORPORATION, Tokyo (JP)

(72) Inventor: Takafumi Omori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 199 days.

(21) Appl. No.: 17/453,073

(22) Filed: Nov. 1, 2021

(65) Prior Publication Data

US 2022/0152768 A1 May 19, 2022

(30) Foreign Application Priority Data

Nov. 19, 2020 (JP) ................................ 2020-192688

(51) Int. Cl.
*B23Q 15/22* (2006.01)
*G05B 19/409* (2006.01)
*H01L 21/67* (2006.01)

(52) U.S. Cl.
CPC .......... *B23Q 15/22* (2013.01); *G05B 19/409* (2013.01); *H01L 21/67092* (2013.01); *B23Q 2716/00* (2013.01); *B23Q 2717/00* (2013.01); *B23Q 2735/00* (2013.01); *G05B 2219/36168* (2013.01)

(58) Field of Classification Search
CPC ................ B23Q 15/22; B23Q 2716/00; B23Q 2717/00; B23Q 2735/00; G05B 19/409; G05B 2219/36168; H01L 21/67092; H01L 21/304; H01L 21/67253; H01L 21/67259; H01L 21/681; H01L 21/68764; B28D 5/0058; B28D 5/0064; B28D 5/0094; B28D 5/02; B28D 5/022; B24B 27/0616; B24B 27/0683
See application file for complete search history.

(56) References Cited

U.S. PATENT DOCUMENTS

| 2013/0222580 | A1 | 8/2013 | Kurahashi |
| 2019/0171328 | A1* | 6/2019 | Chih ........................ G06T 7/73 |
| 2019/0287836 | A1 | 9/2019 | Miyata |
| 2019/0361603 | A1* | 11/2019 | Chen ...................... G09G 3/006 |
| 2019/0369591 | A1* | 12/2019 | Kojo ................... G06F 3/04883 |
| 2020/0033109 | A1 | 1/2020 | Sugita |

FOREIGN PATENT DOCUMENTS

JP 2001084015 A 3/2001

OTHER PUBLICATIONS

Search report issued in counterpart Singapore patent application No. 10202112370Q, dated Feb. 8, 2023.

* cited by examiner

*Primary Examiner* — Mohammad Ali
*Assistant Examiner* — Sheela Rao
(74) *Attorney, Agent, or Firm* — Greer Burns & Crain Ltd.

(57) ABSTRACT

There is provided a processing apparatus including a holding table having a holding surface for holding thereon a workpiece with a plurality of devices formed in respective areas demarcated on a face side of the workpiece by a plurality of projected dicing lines, a processing unit that processes the workpiece held on the holding table, an image capturing unit that captures an image of the workpiece held on the holding table, a moving unit that moves the holding table relatively to the processing unit and the image capturing unit in horizontal directions along the holding surface, a touch panel that displays thereon the image captured by the image capturing unit, and a control unit. The control unit detects a line in an image positioned within an allowable region based on a contact line traced on the image displayed on the touch panel and registers the detected line.

5 Claims, 7 Drawing Sheets

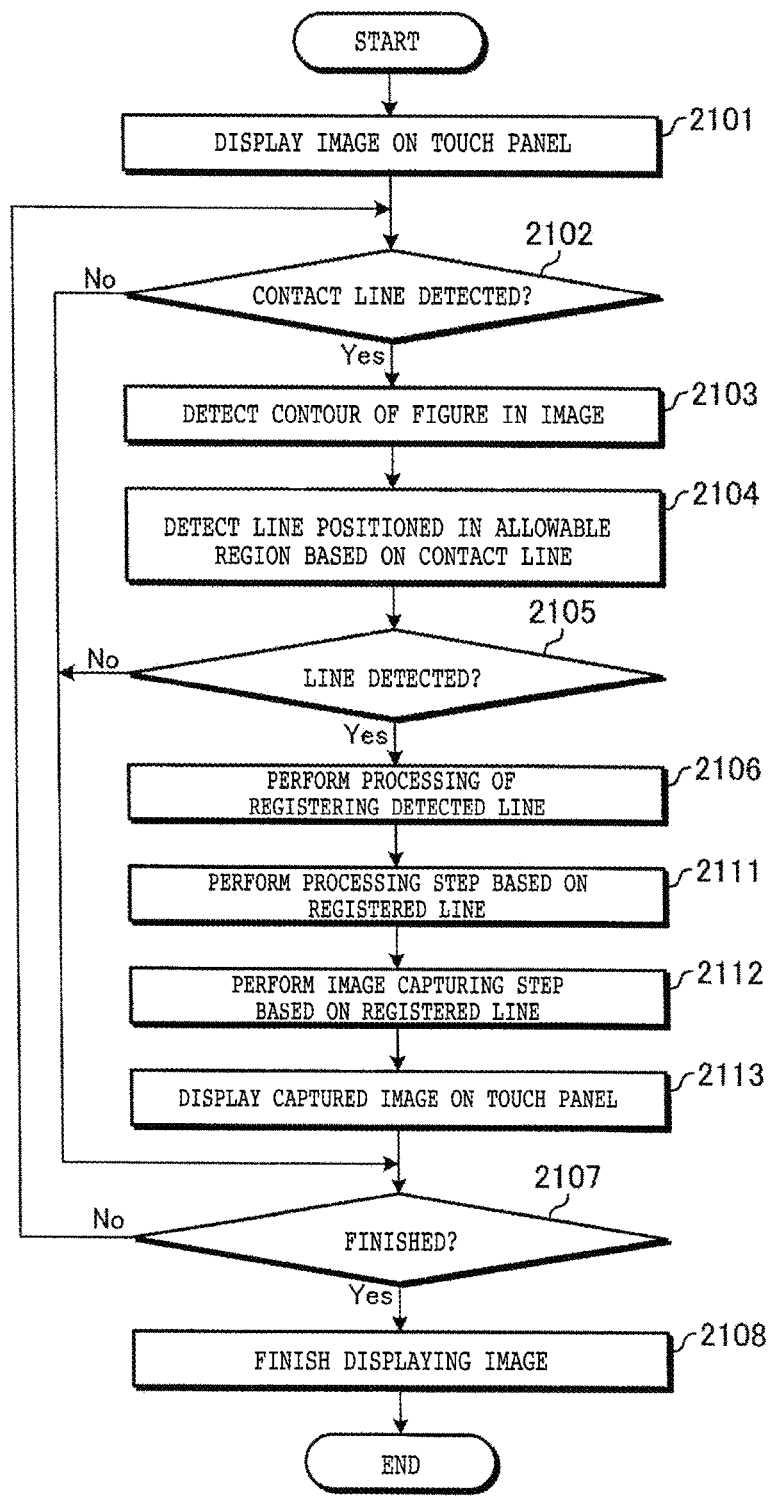

PROCESSING APPARATUS

BACKGROUND OF THE INVENTION

Field of the Invention

The present invention relates to a processing apparatus.

Description of the Related Art

A processing apparatus, in particular a precision processing apparatus that needs to perform precision processing operation, such as a semiconductor fabrication apparatus, is required to control its moving parts to move by distances in the unit of μm. Therefore, it is necessary for the operator to control the operation of the processing apparatus by carefully operating an operation panel installed on or connected to the processing apparatus, to enter various numerical values. For example, JP 2001-84015 A discloses a processing apparatus having an operation panel. This operation panel includes a numerical key pad with numerical keys ranging from 0 to 9 and a digit setting key for setting the digits of a numerical value entered through the numerical key pad as it is operated.

SUMMARY OF THE INVENTION

There have been demands for better operability for the conventional processing apparatus at the time when the operator registers projected dicing lines, processed grooves, patterns, etc., included in a displayed image that has been captured.

Therefore, it is an object of the present invention to provide a processing apparatus that is capable of increasing operability at the time of selecting and registering a portion of a displayed image.

In accordance with an aspect of the present invention, there is provided a processing apparatus including a holding table having a holding surface for holding thereon a workpiece with a plurality of devices formed in respective areas demarcated on a face side of the workpiece by a plurality of projected dicing lines, a processing unit that processes the workpiece held on the holding table, an image capturing unit that captures an image of the workpiece held on the holding table, a moving unit that moves the holding table relatively to the processing unit and the image capturing unit in horizontal directions along the holding surface, a touch panel that displays thereon the image captured by the image capturing unit, and a control unit that detects a line in an image positioned within an allowable region based on a contact line traced on the image displayed on the touch panel and that registers the detected line.

Preferably, the line represents a contour of a pattern that indicates one of the devices in the image displayed on the touch panel, and the control unit registers the pattern corresponding to the detected line, as a key pattern acting as a mark for detecting one of the projected dicing lines.

Preferably, the line represents one of the projected dicing lines or a processed groove formed in the workpiece by the processing unit in the image displayed on the touch panel, and the control unit registers the line as an image capturing route along which the image capturing unit that captures an image of the workpiece is to be moved relatively to the holding table.

The processing apparatus according to the present invention is advantageous in that it is capable of increasing operability at the time of selecting and registering a portion of a displayed image.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7 is a flowchart illustrating another example of the registration processing sequence carried out by the processing apparatus according to the embodiment.

DETAILED DESCRIPTION OF THE PREFERRED EMBODIMENTS

Figure 1:
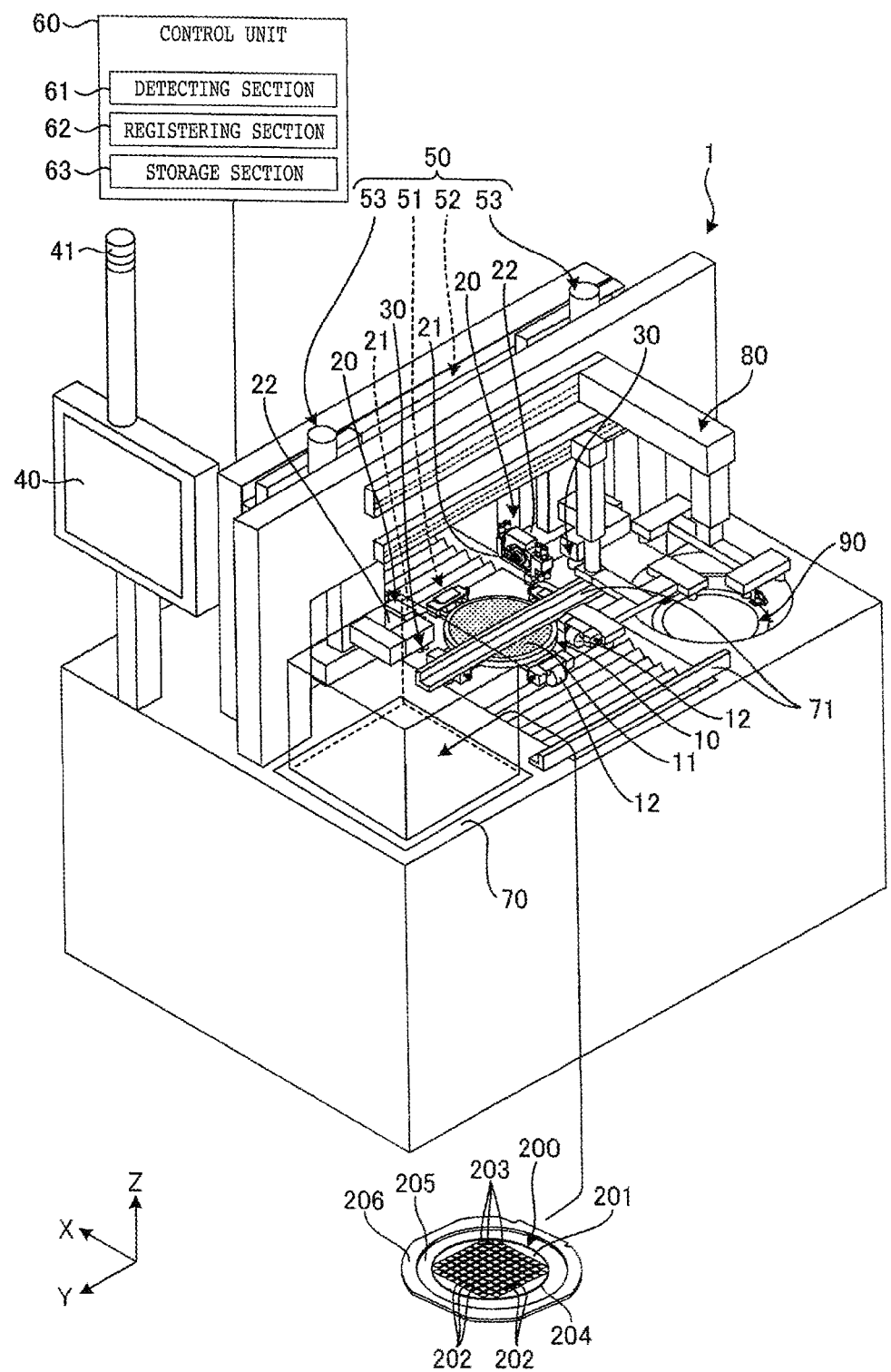
FIG. 1 is a perspective view illustrating a structural example of a processing apparatus according to an embodiment of the present invention.

Preferred embodiments of the present invention will be described in detail hereinbelow with reference to the accompanying drawings. The present invention is not limited to the details of the embodiments described below. The components described below cover those which could easily be anticipated by a person skilled in the art and those which are essentially identical to those described above. Further, the arrangements described below can be combined in appropriate manners. In addition, various omissions, replacements, or changes of the arrangements may be made without departing from the scope of the present invention. In the description to be described below, those components that are identical to each other are denoted by identical reference characters and will be omitted from description.

Embodiments

A processing apparatus according to an embodiment of the present invention will be described in detail hereinbelow with reference to the drawings. FIG. 1 illustrates, in perspective, the processing apparatus according to the present embodiment. As illustrated in FIG. 1, the processing apparatus, which is denoted by 1, according to the present embodiment is an apparatus for cutting a workpiece 200 to form cut grooves as processed marks in the workpiece 200. The processing apparatus 1 is also an apparatus for capturing, displaying, and storing an image of cut grooves, patterns, or the like on a preset inspection route among the cut grooves formed in the workpiece 200 at any timing while or after the workpiece 200 is processed, i.e., cut. According to the present embodiment, the cut groove is an example of a processed mark or a groove produced in the workpiece 200 by the processing apparatus 1. Note that, according to the present invention, the processing apparatus 1 is not limited to the illustrated processing apparatus for forming the cut grooves in the workpiece 200, and may be a laser processing apparatus for applying a laser beam to the workpiece 200 to process the workpiece 200 with the laser beam and form laser-processed grooves in the workpiece 200, and then capturing, displaying, and storing an image of the laser-processed grooves as processed marks on an inspection route on the workpiece 200.

According to the present embodiment, as illustrated in FIG. 1, the workpiece 200 to be cut by the processing apparatus 1 is, for example, a wafer such as a semiconductor wafer or an optical device wafer shaped as a circular plate and made of a base material of silicon, sapphire, silicon carbide (SiC), gallium arsenide, or the like. The workpiece 200 has a flat face side 201, and a plurality of devices 203 are fabricated in respective areas demarcated on the flat face side 201 by a grid of projected dicing lines 202. The workpiece 200 has a reverse side 204 opposite to the face side 201, and an adhesive tape 205 is affixed to the reverse side 204. An annular frame 206 is mounted on an outer edge portion of the adhesive tape 205. Note that, according to the present invention, the workpiece 200 is not limited to the illustrated wafer and may be a rectangular packaged substrate, a ceramic plate, a glass plate, or the like having a plurality of devices encapsulated by a resin.

As illustrated in FIG. 1, the processing apparatus 1 includes a holding table 10, a pair of processing units 20 for performing cutting operation, an image capturing unit 30, a touch panel 40, a moving unit 50, and a control unit 60. According to the embodiment illustrated in FIG. 1, the processing apparatus 1 is a two-spindle dicer, i.e., a facing dual-type cutting apparatus, having the two processing units 20.

The holding table 10 has a holding surface 11 for holding thereon the workpiece 200 that includes the projected dicing lines 202. The holding table 10 includes a chuck table, for example. The holding table 10 is of a disk shape and includes a disk-shaped suction portion and a frame. The suction portion has a flat upper surface as the holding surface 11 for holding the workpiece 200 thereon and is made of porous ceramic or the like that has a number of pores. The frame has a recess defined centrally in an upper surface thereof and receives the suction portion fixedly fitted therein. The holding table 10 is movable along a horizontal X-axis by an X-axis moving mechanism 51 of the moving unit 50, which is to be described later, and is rotatable about a vertical axis by a rotary actuator that is not illustrated. The suction portion of the holding table 10 is connected to an unillustrated vacuum suction source through an unillustrated vacuum suction channel, for holding the workpiece 200 on the holding surface 11 in its entirety under suction forces from the vacuum suction source. As illustrated in FIG. 1, a plurality of clamps 12 for clamping the annular frame 206 in position around the holding surface 11 are disposed at spaced angular intervals on a circumferential edge of the holding table 10.

Each of the processing units 20 processes, i.e., cuts, the workpiece 200 held on the holding table 10 along the projected dicing lines 202 to form cut grooves in the workpiece 200. The processing unit 20 includes a cutting blade 21, a spindle, and a spindle housing 22. The cutting blade 21 is rotatable about a horizontal Y-axis perpendicular to the X-axis, to cut into the workpiece 200 held on the holding table 10. The spindle extends along the Y-axis and supports on its distal end the cutting blade 21. The spindle is rotatable about its central axis along the Y-axis to rotate the cutting blade 21. The spindle is rotatably housed in the spindle housing 22. The processing unit 20 is arranged such that, with respect to the workpiece 200 held on the holding table 10, the spindle housing 22 is movable along the Y-axis by a Y-axis moving mechanism 52 of the moving unit 50, which is to be described later, and is movable along a Z-axis perpendicular to the X-axis and the Y-axis by a Z-axis moving mechanism 53 of the moving unit 50, which is to be described later.

The image capturing unit 30 captures images of the workpiece 200 held on the holding table 10. According to the present embodiment, the image capturing unit 30 is fixed to the processing unit 20 for movement in unison with the processing unit 20. The image capturing unit 30 includes an image capturing device for capturing an image of the projected dicing lines 202 of the workpiece 200 that is held on the holding table 10 and that is yet to be subjected to a cutting step and an image of cut grooves formed as processed marks in the workpiece 200 that has been subjected to the cutting step. The image capturing device is, for example, a charge-coupled device (CCD) or a complementary metal oxide semiconductor (CMOS) device.

The image capturing unit 30 captures an image of the workpiece 200 that is held on the holding table 10 and that is yet to be subjected to a cutting step, to produce an image to be used, for example, in an alignment step for positioning the workpiece 200 with respect to the cutting blade 21. Then, the image capturing unit 30 outputs the obtained image to the control unit 60. In addition, the image capturing unit 30 captures an image of the workpiece 200 that is held on the holding table 10 and that has been subjected to the cutting step, and outputs the obtained image to the control unit 60.

The touch panel 40 is mounted on a main body of the processing apparatus 1 with its display surface facing outwardly. Note that, in the embodiment illustrated in FIG. 1, an upper portion of the main body of the processing apparatus 1 is omitted from illustration. The touch panel 40 is located in such a position on the main body of the processing apparatus 1 where the touch panel 40 can easily be seen and operated by the operator. The touch panel 40 has a display device such as a liquid crystal display or an organic electroluminescent (EL) device and a touch screen on which the operator can designate positions and coordinates of objects on the display surface of the display device. The touch panel 40 is electrically connected to the control unit 60. Under the control of the control unit 60, the touch panel 40 displays images of the face side of the workpiece 200 that have been captured by the image capturing unit 30 and various pieces of information required for a processing operation, and accepts entries required for a processing operation from the operator.

The touch panel 40 can indicate information in cooperation with an indicator unit 41 that is electrically connected to the control unit 60. The indicator unit 41 includes a light-emitting diode (LED) or the like that indicates information based on a cutting step and the states of respective actions related to observation assisting steps including a kerf check.

The moving unit 50 includes the X-axis moving mechanism 51, the Y-axis moving mechanism 52, and a pair of Z-axis moving mechanisms 53. The X-axis moving mechanism 51 moves, i.e., processing-feeds, the holding table 10 in a horizontal direction along the X-axis relatively to the processing units 20. The Y-axis moving mechanism 52 moves, i.e., indexing-feeds, the processing units 20 in another horizontal direction along the Y-axis that is perpendicular to the X-axis relatively to the holding table 10. The Z-axis moving mechanisms 53 move, i.e., incising-feed, the respective processing units 20 in a vertical direction along the Z-axis perpendicular to both the X-axis and the Y-axis relatively to the holding table 10.

The control unit 60 controls the respective components of the processing apparatus 1 to cause the processing apparatus 1 to perform, on the workpiece 200, a cutting step and actions related to observation assisting steps including a kerf check.

The control unit 60 includes an arithmetic processing device having a microprocessor such as a central processing unit (CPU), a storage device having a memory such as a read only memory (ROM) or a random access memory (RAM), and an input/output interface device. The control unit 60 is a computer that can execute control programs for controlling the components of the processing apparatus 1 according to a series of processing steps to be carried out by the processing apparatus 1, by using the components described above of the control unit 60.

The control unit 60 controls overall operation of the processing apparatus 1 according to processing conditions established by the operator via the touch panel 40. The control unit 60 provides a function for controlling the touch panel 40 to display images of the workpiece 200 captured by the image capturing unit 30, and accepting operator's actions to register information with respect to the displayed images. The control unit 60 also provides a function for controlling various units and mechanisms of the processing apparatus 1 on the basis of the registered information.

The control unit 60 includes a detecting section 61, a registering section 62, and a storage section 63. The control unit 60 implements the functions of the detecting section 61, the registering section 62, etc., by executing programs. The storage section 63 is a storage medium incorporated in the control unit 60 herein, but it may be an external storage device outside of the control unit 60.

The detecting section 61 detects a line in an image displayed on the touch panel 40 and positioned within an allowable region based on a contact line tracing the displayed image. The contact line refers to the trajectory, moving path, or the like of a contacting object tracing the display surface of the touch panel 40. A captured image of the workpiece 200 has different contrasts, colors, etc., on the projected dicing lines 202, the devices 203, and key patterns. The contacting object includes, for example, an operator's finger, a touch pen, or the like. The detecting section 61 can detect lines representing boundaries between regions whose contrasts, colors, etc., are different from each other in the image. The lines that can be detected by the detecting section 61 include, for example, straight lines, curves, folding lines, patterns, etc. The detecting section 61 detects a line in an image positioned in the allowable region from the image per a plurality of different pixels on the contact line.

The registering section 62 registers detected lines. Registering a line means registering information that represents the shape, position, pattern, etc., of the line, for example. The registering section 62 registers registration information for displaying, on an image, a line detected by the detecting section 61. The registration information includes, for example, information representing the position of the line on the image, information linking the image and the line with each other, information for overlappingly displaying the line on the image, and other information. The registering section 62 registers the registration information in the storage section 63, an external storage device, or the like.

For example, it is assumed that a line detected by the detecting section 61 represents the contour of a pattern that indicates a device 203. In this case, the registering section 62 registers the pattern corresponding to the detected line, as a key pattern that represents a mark for detecting a projected dicing line 202. The pattern corresponding to the detected line is a pattern having a contour adjacent to the detected line.

For example, it is assumed that a line detected by the detecting section 61 represents a projected dicing line 202 or a processed groove formed by the processing unit 20 in an image displayed by the touch panel 40. In this case, the registering section 62 registers the detected line as an image capturing route along which to move, relatively to the holding table 10, the image capturing unit 30 that captures the workpiece 200.

The control unit 60 provides a function for controlling operation of the processing apparatus 1 on the basis of the information of the line registered by the registering section 62. For example, the control unit 60 controls the units and mechanisms of the processing apparatus 1 according to the registered line. If the registered line represents a key pattern, for example, then the control unit 60 performs processing of detecting a projected dicing line 202 by using the key pattern as a mark. Specifically, the control unit 60 automatically detects the position of a projected dicing line 202 on the basis of the distance from the registered key pattern to the projected dicing line 202. If the registered line represents the contour of a projected dicing line 202, for example, then the control unit 60 performs processing of processing the workpiece 200 along the projected dicing line 202. If the registered line represents the contour of a processed groove, for example, then the control unit 60 performs processing of controlling the image capturing unit 30 to capture an image of an image capturing route represented by the line.

The storage section 63 stores images captured by the image capturing unit 30 and various pieces of information including registration information, etc. The storage section 63 stores images and registration information in relation to each other. The storage section 63 can store images of the workpiece 200 captured by the image capturing unit 30 at respective positions on paths of the inspection route.

Further, the processing apparatus 1 also includes, as illustrated in FIG. 1, a cassette 70 for housing workpieces 200 that are yet to be cut and workpieces 200 that have been cut, a temporary rest unit 71 for temporarily placing thereon workpieces 200 that are yet to be housed in the cassette 70 and workpieces 200 that have been housed in the cassette 70, a cleaning unit 90 for cleaning workpieces 200 that have been cut, and a delivery unit 80 for delivering workpieces 200 between the holding table 10, the cassette 70, the temporary rest unit 71, and the cleaning unit 90.

The processing apparatus 1 operates as follows. After processing conditions including information representing the number of projected dicing lines 202 on workpieces 200, spacings between the projected dicing lines 202, etc., have been registered in the control unit 60, the delivery unit 80 takes out a workpiece 200 from the cassette 70, positions the workpiece 200 in a predetermined position on the temporary rest unit 71, and then places the workpiece 200 onto the holding surface 11 of the holding table 10. The workpiece 200 is held under suction on the holding surface 11 of the holding table 10, and the alignment step is performed on the workpiece 200. Thereafter, while a cutting fluid is being supplied from the processing unit 20 to the workpiece 200, the rotary actuator and the moving unit 50 move the holding table 10 and the processing unit 20 relatively to each other along the projected dicing lines 202 on the workpiece 200, and at the same time, the cutting blade 21 of the processing unit 20 cuts the workpiece 200 along each of the projected dicing lines 202, forming cut grooves in the workpiece 200 along the projected dicing lines 202. After the workpiece 200 has been cut along all the projected dicing lines 202, the workpiece 200 is delivered to the cleaning unit 90 by the delivery unit 80. After the workpiece 200 has been cleaned by the cleaning unit 90, the workpiece 200 is housed into the cassette 70 by the delivery unit 80.

The structural example of the processing apparatus 1 according to the embodiment has been described above. Note that the structural details and functions of the processing apparatus 1 described above are by way of illustrative example only, and the processing apparatus 1 is not limited to the illustrated structural details and functions. The structural details and functions of the processing apparatus 1 can flexibly be changed or modified depending on desired specifications and operational details.

(Example of Registration on the Processing Apparatus)

Figure 2:
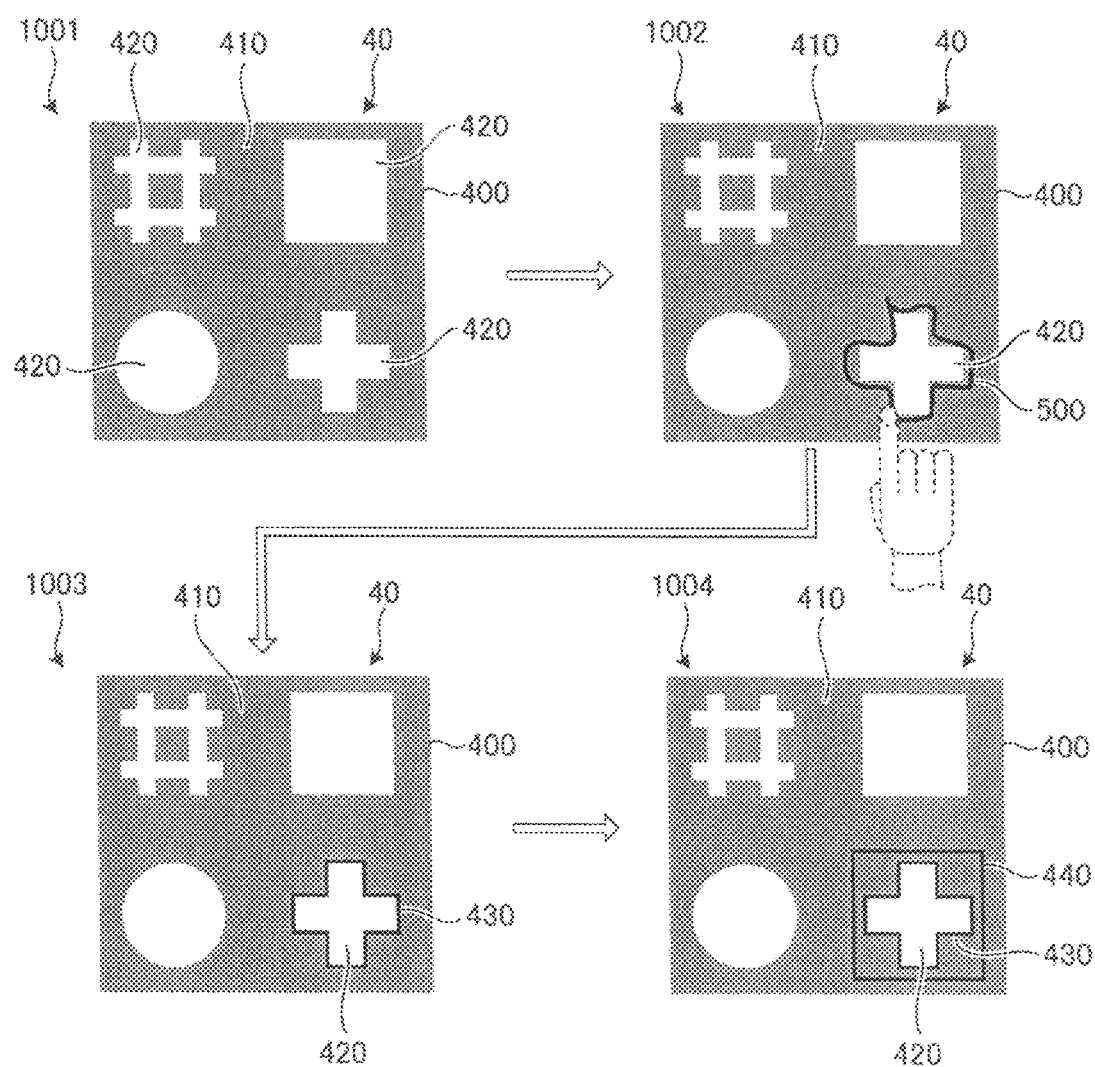
FIG. 2 is a view illustrative of an example in which the processing apparatus according to the embodiment registers a line in an image.
Figure 3:
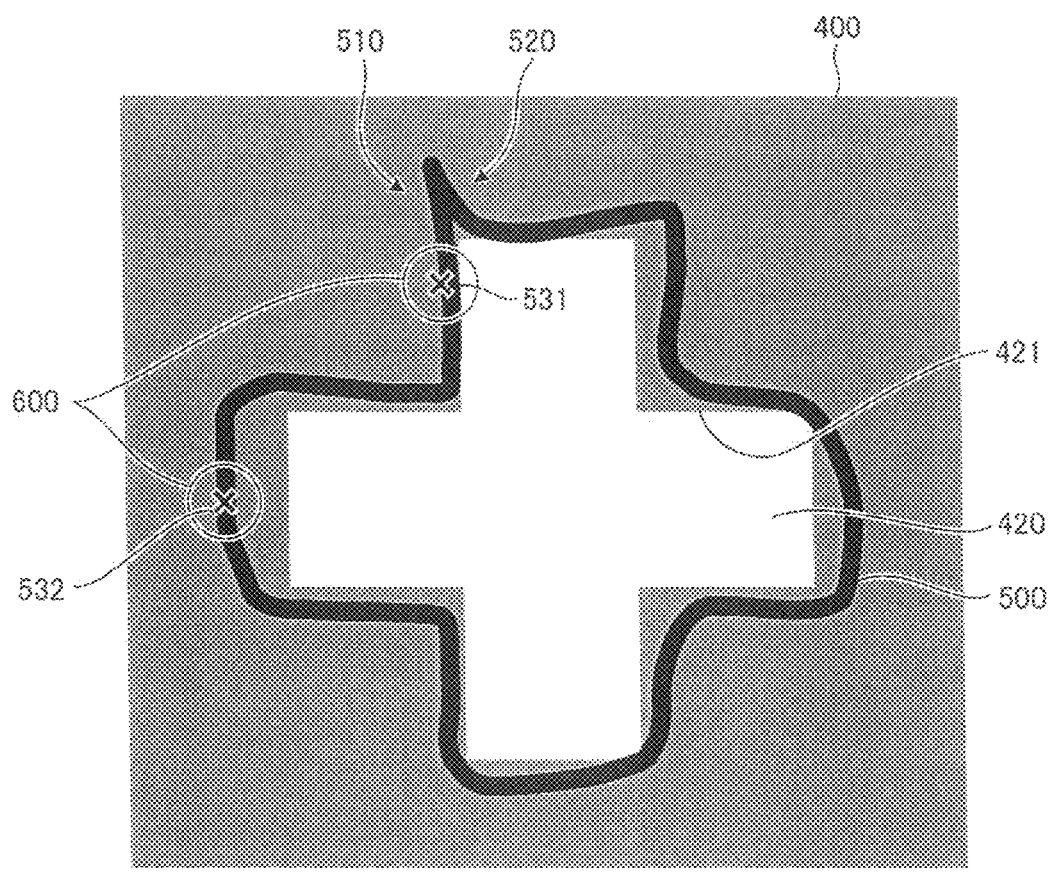
FIG. 3 is a view illustrative of an example in which the line in the image illustrated in FIG. 2 is detected.

An example in which the processing apparatus 1 according to the present embodiment registers a line in an image will be described below. FIG. 2 illustrates the example in which the processing apparatus 1 according to the present embodiment registers a line in an image. FIG. 3 illustrates an example in which the line in the image, which is denoted by 400, illustrated in FIG. 2 is detected.

In a scene 1001 illustrated in FIG. 2, the processing apparatus 1 displays, on the touch panel 40, an image 400 obtained by capturing the workpiece 200. The image 400 includes a first image 410 obtained by capturing a device 203 on the workpiece 200 and a plurality of (four in the illustrated embodiment) second images 420 obtained by capturing a plurality of key patterns on the device 203. The first image 410 is darker in contrast than the four second images 420. The processing apparatus 1 determines contrast per pixel of the image 400, groups clusters of those pixels having the same contrast, and recognizes the grouped clusters as the second images 420 that represent figures. By using a known edge detecting technique or the like, the processing apparatus 1 detects, as contours, the edges of the figures represented by the second images 420 and stores the detected contours in the storage section 63 in relation to the image 400. In other words, the processing apparatus 1 detects the contours of the four figures in the image 400.

In a scene 1002, the operator traces freehand the contour of one of the second images 420 displayed on the touch panel 40. Consequently, the operator is unable to trace the contour of the second image 420 accurately as indicated by a contact line 500, with its finger as a contacting object. The processing apparatus 1 detects the contact line 500 that represents the trajectory of the moving contacting object, via the touch panel 40. The processing apparatus 1 detects, as the contact line 500, the trajectory of the contacting object from a point where the contacting object starts moving on the touch panel 40 to a point where the contacting object finishes moving on the touch panel 40. The contact line 500 has information of positions, directions, etc., of a plurality of contact points. The processing apparatus 1 controls the touch panel 40 to display the contact line 500 overlappingly on the image 400.

As illustrated in FIG. 3, the processing apparatus 1 detects lines of the image 400 that are positioned within allowable regions 600 based on the contact line 500. Each of the allowable regions 600 represents a region around any position on the contact line 500, for example, and the respective allowable regions 600 are established at a plurality of different positions on the contact line 500. For example, the processing apparatus 1 detects the contour of the second image 420 that is included in each of the allowable regions 600 established at a plurality of positions (pixels) on the contact line 500 from a starting position 510 to an ending position 520. Each of the allowable regions 600 can be established as desired depending on the scale, size, etc., of the image 400. For example, each of the allowable regions 600 may be established by a number of pixels such as 30 pixels or less. Each of the allowable regions 600 may be predefined by a program or may be stored in the storage section 63, for example. In the present embodiment, each of the allowable regions 600 has a circular shape, but it may have another shape such as a square shape or a criss-cross shape, for example.

In the example illustrated in FIG. 3, in the case of a position 531 on the contact line 500, for example, the processing apparatus 1 determines that the contour of the second image 420 is present within the allowable region 600. In the case of a position 532 on the contact line 500, for example, the processing apparatus 1 determines that the contour of the second image 420 is not present within the allowable region 600. When the processing apparatus 1 finishes determining the contour of the second image 420 at a plurality of positions on the contact line 500 from the starting position 510 to the ending position 520, the processing apparatus 1 calculates a proportion of the cases in which it has determined that the contour of the second image 420 is present within the allowable region 600. The proportion is represented by the result obtained by dividing the number of times that the processing apparatus 1 has determined that the contour of the second image 420 is present within the allowable region 600, by the total number of times that the processing apparatus 1 has determines the contour of the second image 420 at the positions on the contact line 500 from the starting position 510 to the ending position 520. If the calculated proportion is larger than a threshold value, then the processing apparatus 1 detects a contour 421 of the second image 420 as a line and registers the detected line. On the other hand, if the calculated proportion is not larger than the threshold value, then the processing apparatus 1 does not detect the contour 421 of the second image 420 as a line.

In a scene 1003 illustrated in FIG. 2, if the processing apparatus 1 detects the contour 421 of the second image 420 as a line 430 of the image 400, then the processing apparatus 1 controls the touch panel 40 to display the line 430 overlappingly on the contour 421 of the second image 420. Now, the operator can confirm that the contour 421 of a pattern represented by the second image 420 has been selected by referring to the line 430 displayed on the touch panel 40.

In a scene 1004, in a case where the detected line 430 represents the contour 421 of the pattern, the processing apparatus 1 registers the second image 420 surrounded by the line 430 as a key pattern. When the processing apparatus 1 registers a key pattern for detecting the position of a projected dicing line 202, there is a need to register not only the pattern but also a peripheral area of different contrast. According to the present embodiment, the processing apparatus 1 registers, as a key pattern acting as a mark, registration information regarding an area 440 that includes the second image 420 representing the pattern surrounded by the detected line 430 and that is enlarged to predetermined distances upwardly, downwardly, leftwardly, and rightwardly from the second image 420. In the present embodiment, the area 440 has a square shape, but it may have a similar shape enlarged upwardly, downwardly, leftwardly, and rightwardly from an outer periphery of the second image 420, for example. The similar shape is less likely to include other patterns not required to identify a key pattern, resulting in increased detection accuracy.

(Example of Registration Control of the Processing Apparatus)

Figure 4:
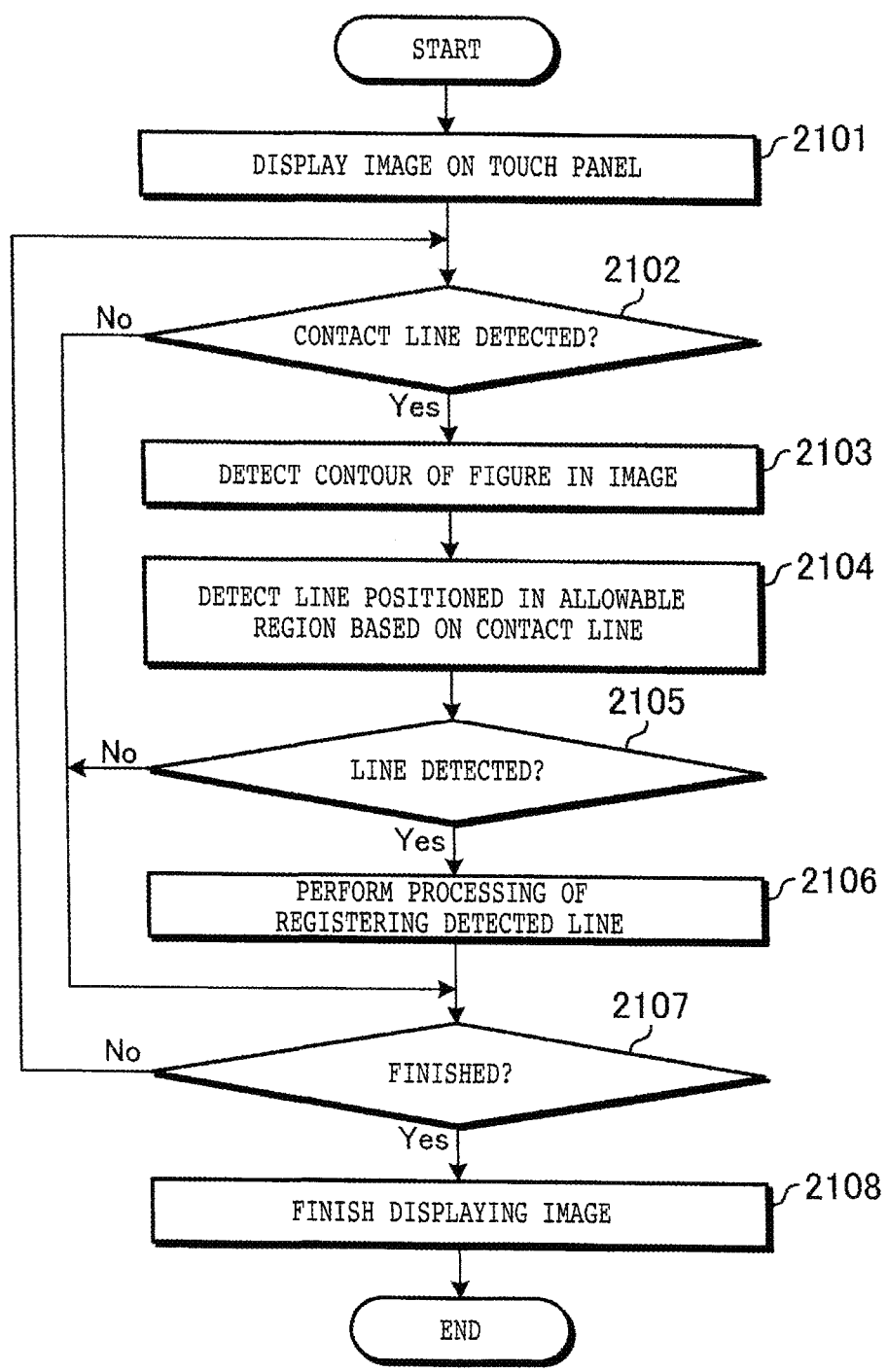
FIG. 4 is a flowchart illustrating an example of a registration processing sequence carried out by the processing apparatus according to the embodiment.

Next, an example of a processing sequence carried out by the processing apparatus 1 according to the present embodiment will be described. FIG. 4 is a flowchart illustrating an example of a registration processing sequence carried out by the processing apparatus 1 according to the present embodiment. The processing sequence illustrated in FIG. 4 is performed when the control unit 60 of the processing apparatus 1 executes programs. The processing sequence illustrated in FIG. 4 is carried out by the control unit 60 of the processing apparatus 1.

According to the registration processing sequence, the control unit 60 of the processing apparatus 1 displays the image 400 on the touch panel 40 (step 2101). For example, the control unit 60 controls the touch panel 40 to display the image 400 obtained by capturing the workpiece 200 held on the holding table 10 by the image capturing unit 30. In the processing apparatus 1, the image 400 of the workpiece 200 is thus displayed on the touch panel 40. When the processing in step 2101 is finished, the control unit 60 proceeds to the processing in step 2102.

The control unit 60 determines whether or not it has detected a contact line 500 (step 2102). For example, when the control unit 60 has detected a contact line 500 via the touch panel 40 on the basis of the trajectory, moving path, or the like of a contacting object, the control unit 60 determines that it has detected the contact line 500. If the control unit 60 determines that it has not detected a contact line 500 (No in step 2102), the control unit 60 proceeds to the processing in step 2107 to be described later. If the control unit 60 determines that it has detected a contact line 500 (Yes in step 2102), the control unit 60 proceeds to the processing in step 2103 to be described below.

The control unit 60 detects the contour of a figure in the image 400 (step 2103). For example, the control unit 60 detects, as a contour, a boundary of contrast, color, or the like in the image 400. The control unit 60 may use the image 400 in its entirety as a contour detection target or may use only an area neighboring the contact line 500 as a contour detection target. When the processing in step 2103 is finished, the control unit 60 proceeds to the processing in step 2104.

The control unit 60 detects a line 430 positioned within an allowable region 600 based on contact line 500 (step 2104). For example, the control unit 60 detects a line 430 of the image 400 positioned within each of the allowable regions 600 at a plurality of different positions (pixels) on the contact line 500 from the starting position 510 to the ending position 520. The control unit 60 stores, in the storage section 63, the result indicating whether or not it has detected, as a line 430, a boundary line in the image 400 adjacent to the contact line 500. When the processing in step 2104 is finished, the control unit 60 proceeds to the processing in step 2105.

The control unit 60 determines whether or not it has detected a line 430 (step 2105). For example, when the detection result from step 2104 indicates that the control unit 60 has detected a line 430, the control unit 60 determines that it has detected a line 430. If the control unit 60 determined that it has not detected a line 430 (No in step 2105), then the control unit 60 proceeds to the processing in step 2107. If the control unit 60 determined that it has detected a line 430 (Yes in step 2105), then the control unit 60 proceeds to the processing in step 2106.

The control unit 60 performs processing of registering the detected line 430 (step 2106). For example, the control unit 60 performs processing of registering the registration information indicating a pattern represented by the detected line 430, as a key pattern acting as a mark for detecting a projected dicing line 202. For example, if the detected line 430 is a straight line, then the control unit 60 performs processing of registering the registration information indicating the detected line 430, as a line 430 along a projected dicing line 202 or a processed groove formed by the processing unit 20. When the processing in step 2106 is finished, the control unit 60 proceeds to the processing in step 2107.

The control unit 60 determines whether or not the processing thus far is to be finished (step 2107). For example, if a condition for finishing the registration processing is satisfied, then the control unit 60 determines that the registration processing is to be finished. The condition for finishing the registration processing includes a condition in which a finishing instruction from the operator is received, for example. If the control unit 60 determines that the registration processing is not to be finished (No in step 2107), then the control unit 60 returns to the processing in step 2102 described above and repeats the processing. If the control unit 60 determines that the registration processing is to be finished (Yes in step 2107), then the control unit 60 proceeds to the processing in step 2108.

The control unit 60 finishes displaying the image 400 on the touch panel 40 (step 2108). For example, the control unit 60 controls the touch panel 40 to finish displaying the image 400 on the touch panel 40, thereby finishing displaying the image 400. When the processing in step 2108 is finished, the control unit 60 puts an end to the processing sequence illustrated in FIG. 4.

According to the processing sequence illustrated in FIG. 4, the control unit 60 detects the contour of a figure in the image 400 in step 2103. However, the present invention is not limited to such a detail. For example, the control unit 60 may detect the contour of a figure in the image 400 as a step performed before or after the image 400 is displayed on the touch panel 40 in step 2101. For example, the processing apparatus 1 may detect the contour of a figure in the image 400 when the image 400 is captured.

As described above, the processing apparatus 1 is able to detect and register a line 430 of the image 400 that is positioned in the allowable regions 600 based on the contact line 500 traced on the image 400 displayed on the touch panel 40. The processing apparatus 1 can thus register any line 430 of the image 400 simply by having the operator operate the touch panel 40 to trace closely a boundary line, a contour, a pattern, or the like to be selected in the image 400 displayed on the touch panel 40. As a result, the processing apparatus 1 has its operability increased in selecting and registering a portion of the displayed image 400.

In addition, in a case where a line 430 represents the contour of a pattern that indicates a device 203 in the image 400 displayed on the touch panel 40, the processing apparatus 1 can register the detected pattern as a key pattern acting as a mark for detecting a projected dicing line 202. The processing apparatus 1 is thus able to register any line 430 of the image 400 as a key pattern simply by having the operator operate the touch panel 40 to trace closely the contour of the device 203 indicated by the image 400. As a consequence, even if a line 430 is of a complex shape or is traced in a shifted position on the displayed image 400, the processing apparatus 1 can correct and select the line 430 as representing the contour of a pattern that indicates a device 203. Therefore, the processing apparatus 1 has its operability increased in registering a key pattern.

Further, it has heretofore been customary to scale up or down the size of a quadrangular frame in order to include a pattern acting as a mark therein, move the quadrangular frame, and establish an image in the quadrangular frame as a key pattern. In contrast, the processing apparatus 1 according to the present embodiment can be operated with a reduced number of actions for better efficiency in establishing a key pattern simply by having the operator trace freehand closely the contour of a pattern that indicates a device 203.

(Another Example of Registration on the Processing Apparatus)

Figure 5:
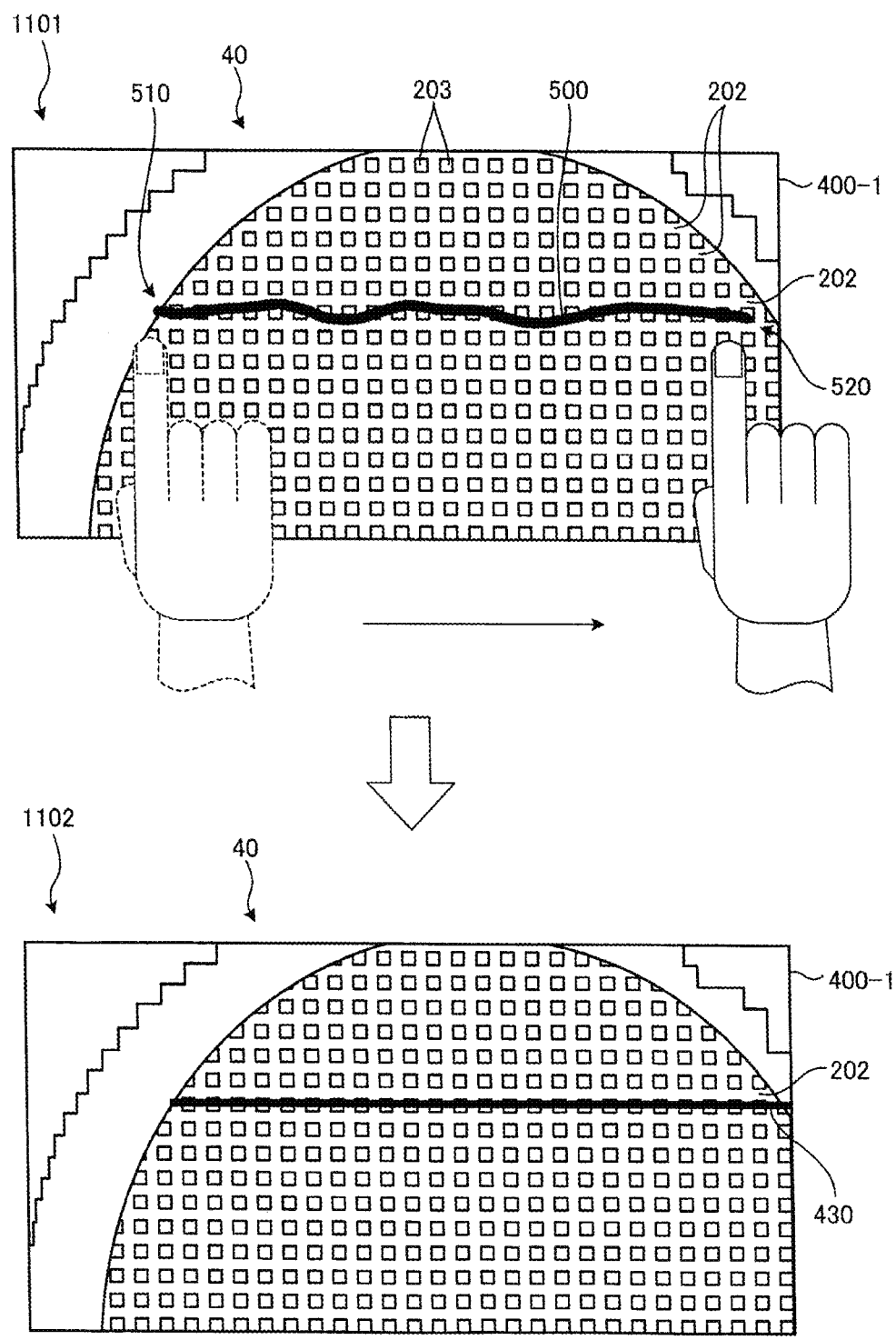
FIG. 5 is a view illustrative of another example in which the processing apparatus according to the embodiment registers a line in an image.
Figure 6:
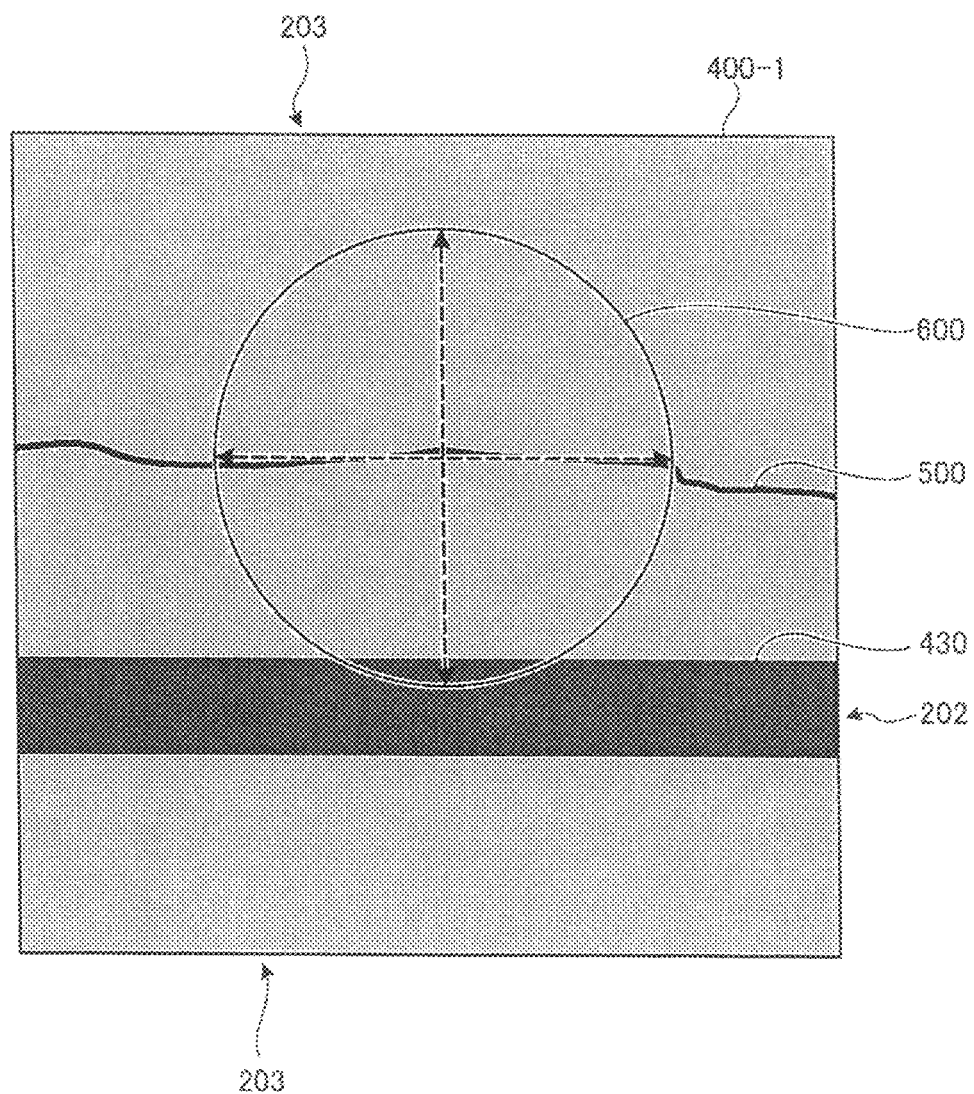
FIG. 6 is a view illustrative of an example in which the line in the image illustrated in FIG. 5 is detected.

Next, another example in which the processing apparatus 1 according to the present embodiment registers a line 430 of an image will be described. FIG. 5 illustrates the other example in which the processing apparatus 1 according to the present embodiment registers a line 430 of an image. FIG. 6 illustrates an example in which the line 430 of the image, which is denoted by 400-1, illustrated in FIG. 5 is detected.

There is a situation in which, after one of the projected dicing lines 202 of the workpiece 200 has been processed, an image of the processed projected dicing line 202 is captured, and the operator confirms the state of the cut groove formed in the workpiece 200 along the projected dicing line 202. In such a situation, the processing apparatus 1 provides a function for allowing the operator to register freehand a projected dicing line 202 as a processing target to be processed and an image capturing route.

In a scene 1101 illustrated in FIG. 5, the processing apparatus 1 displays, on the touch panel 40, an image 400-1 obtained by capturing the workpiece 200. The image 400-1 covers a partial region of the workpiece 200 that includes a region where the processing apparatus 1 processes the workpiece 200 along a projected dicing line 202. The image 400-1 includes, for example, images representing projected dicing lines 202, devices 203, etc.

In order to confirm the state of a cut groove formed in the workpiece 200 after it has been processed by the processing apparatus 1, the operator traces freehand a projected dicing line 202 to be registered as a processing target and as an image capturing route on the display surface of the touch panel 40.

In the scene 1101, the processing apparatus 1 detects a contact line 500 from a starting position 510 to an ending position 520 via the touch panel 40. As illustrated in FIG. 6, the processing apparatus 1 detects the boundary line of a contour positioned in an allowable region 600 based on the contact line 500 on the basis of the contours of figures in the image 400-1. For example, the processing apparatus 1 detects the lines of the contours of a projected dicing line 202 and a device 203. Since the proportion of the cases in which the line of the contour of the projected dicing line 202 is present within the allowable region 600 is higher, the processing apparatus 1 selects the line of the contour of the projected dicing line 202 as a line 430. The processing apparatus 1 registers the line 430 by storing, in the storage section 63, registration information that represents the line 430 as the contour of the projected dicing line 202. According to the present embodiment, the processing apparatus 1 registers the detected line 430 as the projected dicing line 202 to be processed and as the image capturing route.

In a scene 1102 illustrated in FIG. 5, the processing apparatus 1 controls the touch panel 40 to display the detected line 430, thereby displaying the line 430 as a straight line along the contour of the selected projected dicing line 202. The processing apparatus 1 can thus have the operator confirm that the processing apparatus 1 has registered the displayed line 430.

After having registered the line 430, the processing apparatus 1 may perform processing of forming a cut groove in the workpiece 200 along one line by identifying the projected dicing line 202 on the basis of the line 430 and processing the workpiece 200 held on the holding table 10 along the projected dicing line 202 according to an instruction from the operator. Alternatively, after having registered the line 430, the processing apparatus 1 may capture the state of a cut groove by moving the image capturing unit 30 along the line 430. Consequently, in a case where the processing apparatus 1 is to capture images of a plurality of regions, the processing apparatus 1 can provide the operator with images obtained by capturing a cut groove along one line, without the operator taking action to move an image capturing region a plurality of times. For example, the processing apparatus 1 can display, on the touch panel 40, an image obtained by capturing a cut groove along one line.

(Another Example of Registration Control of the Processing Apparatus)

Next, another example of a processing sequence carried out by the processing apparatus 1 according to the present embodiment will be described. FIG. 7 is a flowchart illustrating an example of the registration processing sequence carried out by the processing apparatus 1 according to the present embodiment. The processing sequence illustrated in FIG. 7 is performed when the control unit 60 of the processing apparatus 1 executes programs. The processing sequence illustrated in FIG. 7 is appropriately carried out by the control unit 60 of the processing apparatus 1.

According to the processing sequence illustrated in FIG. 7, the processing in steps 2101 through 2108 is identical to the processing in steps 2101 through 2108 illustrated in FIG. 4 and will be omitted from description.

As illustrated in FIG. 7, when the processing in step 2106 is finished, the control unit 60 of the processing apparatus 1 performs a processing step based on the registered line 430 (step 2111). For example, by performing the processing step, the control unit 60 identifies a projected dicing line 202 on the basis of the line 430 and controls the processing unit 20 to process the workpiece 200 held on the holding table 10 along the projected dicing line 202. When the processing in step 2111 is finished, the control unit 60 proceeds to the processing in step 2112.

The control unit 60 then performs an image capturing step based on the registered line 430 (step 2112). For example, by performing the image capturing step, the control unit 60 controls the image capturing unit 30 and the moving unit 50 to capture an image of the processed state while moving the image capturing unit 30 along the line 430. When the processing in step 2112 is finished, the control unit 60 proceeds to the processing in step 2113.

The control unit 60 displays the captured image on the touch panel 40 (step 2113). For example, the control unit 60 controls the touch panel 40 to display the image captured by the image capturing unit 30. The processing apparatus 1 now displays, on the touch panel 40, the image obtained by capturing a processed groove formed in the workpiece 200. When the processing in step 2113 is finished, the control unit 60 proceeds to the processing in step 2107 described above.

The control unit 60 determines whether or not the registration processing is to be finished (step 2107). If the control unit 60 determines that the processing thus far is not to be finished (No in step 2107), then the control unit 60 returns to the processing in step 2102 described above and repeats the processing. If the control unit 60 determines that the processing is to be finished (Yes in step 2107), then the control unit 60 proceeds to the processing in step 2108.

The control unit 60 finishes displaying the image 400 on the touch panel 40 (step 2108). For example, the control unit 60 controls the touch panel 40 to finish displaying the image 400 on the touch panel 40, thereby finishing displaying the image 400. When the processing in step 2108 is finished, the control unit 60 puts an end to the processing sequence illustrated in FIG. 7.

As described above, in a case where a line 430 represents a projected dicing line 202 or a processed groove formed in the workpiece 200 by the processing unit 20 in an image 400 displayed on the touch panel 40, the processing apparatus 1 can register the line 430 as an image capturing route along which the image capturing unit 30 for capturing images of the workpiece 200 is to be moved relatively to the holding table 10. Therefore, simply by having the operator operate the touch panel 40 to trace closely the contour of the projected dicing line 202 or the processed groove in the image 400, the processing apparatus 1 can correct the traced line as a line 430 along the projected dicing line 202 or the processed groove even if the line traced by the operator is shifted. Therefore, the processing apparatus 1 can easily register any line 430 of the image 400 as an image capturing route. As a result, in a case where the processing apparatus 1 is to capture images of a plurality of regions, the processing apparatus 1 does not require the operator to select and register at a plurality of times the projected dicing line 202 or the processed groove in the image 400 that is displayed for changing image capturing regions, and thus has better operability.

According to the above embodiment, the processing apparatus 1 detects and registers a single line 430 positioned in an allowable region 600 based on the contact line 500. However, the present invention is not limited to such a detail. For example, in a case where a plurality of boundary lines are present in an allowable region 600 based on the contact line 500, the processing apparatus 1 may be configured to register a plurality of lines 430.

Other Embodiments

The processing apparatus according to the present invention is not limited to the above embodiment, and various changes and modifications may be made therein without departing from the scope of the invention. For example, the processing apparatus 1 according to the present invention may be a grinding apparatus or a laser processing apparatus instead of a cutting apparatus.

Further, the components of the processing apparatus 1 according to the present embodiment as described above are basically functional and conceptual and may not necessarily be physically constructed as illustrated. Specifically, the components of the processing apparatus 1 are not limited to the discrete and integrated forms as specifically illustrated, and may wholly or partly be discrete and integrated functionally or physically into any units depending on various loads thereon and situations in which they are used. For example, the detecting section 61 and the registering section 62 of the processing apparatus 1 may be integrated or combined functionally.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
a holding table having a holding surface for holding thereon a workpiece with a plurality of devices formed in respective areas demarcated on a face side of the workpiece by a plurality of projected dicing lines;
a processing unit that processes the workpiece held on the holding table;
an image capturing unit that captures an image of the workpiece held on the holding table;
a moving unit that moves the holding table relatively to the processing unit and the image capturing unit in horizontal directions along the holding surface;
a touch panel that displays thereon the image captured by the image capturing unit, wherein the image captured by the image capturing unit includes a contour corresponding to edges of the image; and
a control unit that detects a line in the image based on whether points on the contour of the image are positioned within a plurality of allowable regions on a contact line traced on the image displayed on the touch panel and registers the detected line, wherein each of the plurality of allowable regions is a region around a position on the contact line;
wherein the line in the image represents one of the projected dicing lines or a processed groove formed in the workpiece by the processing unit in the image displayed on the touch panel, and
wherein the control unit registers the line in the image as an image capturing route along which the image capturing unit that captures an image of the workpiece is to be moved relatively to the holding table.

2. The processing apparatus according to claim 1, wherein:
the line in the image represents a pattern that indicates one of the devices in the image displayed on the touch panel, and
the control unit registers the pattern corresponding to the detected line, as a key pattern acting as a mark for detecting one of the projected dicing lines.

3. The processing apparatus according to claim 1, wherein the contact line is a trajectory of a contacting object tracing the image displayed of the touch panel.

4. The processing apparatus according to claim 1, wherein the control unit calculates a proportion of the points on the contour of the image which are not within one of the plurality of allowable regions, and determines whether the contour is the line on the image based on whether the proportion is greater than a threshold value.

5. The processing apparatus according to claim 1, wherein the at least one allowable region has a circular shape.

* * * * *